(12) United States Patent
Cimino et al.

(10) Patent No.: US 11,599,069 B1
(45) Date of Patent: Mar. 7, 2023

(54) METHOD FOR AUTO-TUNING AND PROCESS PERFORMANCE ASSESSMENT OF CHAMBER CONTROL

(71) Applicant: Applied Materials, Inc., Santa Clara, CA (US)

(72) Inventors: Mauro Cimino, Santa Clara, CA (US); Arkaprava Dan, San Jose, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/467,020

(22) Filed: Sep. 3, 2021

(51) Int. Cl.
  *G05B 13/02* (2006.01)
  *H01L 21/67* (2006.01)
(52) U.S. Cl.
  CPC ......... *G05B 13/025* (2013.01); *G05B 13/022* (2013.01); *H01L 21/67248* (2013.01); *H01L 21/67276* (2013.01)
(58) Field of Classification Search
  None
  See application file for complete search history.

(56) References Cited

U.S. PATENT DOCUMENTS

| 6,629,009 | B1 | 9/2003 | Tamaki |
| 10,375,251 | B2 * | 8/2019 | Mani ....................... H04M 1/20 |
| 2013/0338808 | A1 | 12/2013 | Baseman et al. |

FOREIGN PATENT DOCUMENTS

| JP | 2010171369 A | 8/2010 |
| KR | 1020080040804 A | 5/2008 |
| WO | 20210303640 A1 | 2/2021 |

OTHER PUBLICATIONS

International Search Report and Written Opinion from PCT/US2022/040194 dated Dec. 6, 2022, 10 pgs.

\* cited by examiner

*Primary Examiner* — Carlos R Ortiz Rodriguez
(74) *Attorney, Agent, or Firm* — Schwabe, Williamson & Wyatt, P.C.

(57) ABSTRACT

Embodiments disclosed herein include a method for auto-tuning a system. In an embodiment, the method comprises determining if the system is in a steady state. Thereafter, the method includes exciting the system. In an embodiment, the method comprises storing process feedback measurements from the excited system to provide a set of stored data. In an embodiment, the set of stored data is a subset of all available data generated by the excited system. In an embodiment, the method further comprises determining when the excited system returns to the steady state, and tuning the system using the set of stored data.

20 Claims, 8 Drawing Sheets

METHOD FOR AUTO-TUNING AND PROCESS PERFORMANCE ASSESSMENT OF CHAMBER CONTROL

BACKGROUND

1) Field

Embodiments of the present disclosure pertain to the field of semiconductor processing and, in particular, to auto-tuning and process performance assessment of chamber control in semiconductor processing environments.

2) Description of Related Art

In the semiconductor industry processing tools have grown to be incredibly complex systems. In an effort to improve process uniformity, the processing tools have be fitted with numerous sensors to measure various process parameters. The sensors may be part of a control architecture that is used to modulate actuators that can, in turn, alter the process parameters. For example, some process parameters in semiconductor tools include, but are not limited to, temperature, pressure, RF frequency, power, and the like. During the process of setting up such semiconductor tools, the control parameters of a system (e.g., gain values) need to be set in order to provide accurate and precise control of the semiconductor tool. Currently, engineers assigned to the tuning task are required to possess specific skills to accomplish the task, hence extending even further the chamber setup time due to potential unavailability of such engineers.

After an extended period of operation of the chamber, it is normal for some of the hardware components to show altered behavior and/or performance. As such, re-tuning the different closed-loop controllers may be a process used to compensate for such a drift. However, this task also requires a significant amount of engineering time, corresponding to an equally long period of chamber down-time.

SUMMARY

Embodiments disclosed herein include a method for auto-tuning a system. In an embodiment, the method comprises determining if the system is in a steady state. Thereafter, the method includes exciting the system. In an embodiment, the method comprises storing process feedback measurements from the excited system to provide a set of stored data. In an embodiment, the set of stored data is a subset of all available data generated by the excited system. In an embodiment, the method further comprises determining when the excited system returns to the steady state, and tuning the system using the set of stored data.

An additional embodiment, includes a method of monitoring a recipe performance in a semiconductor processing tool. In an embodiment, the method comprises determining a level of noise in a system. After the noise level is determined, embodiments include storing process feedback measurements from the system to provide a set of stored data. In an embodiment, the set of stored data is a subset of all available data generated by the system. In an embodiment, the method further comprises comparing the set of stored data with a set of reference data.

Embodiments may also include a semiconductor processing tool. In an embodiment, the tool comprises a chamber, and a plurality of components interfacing with the chamber. In an embodiment, each of the components are controlled with a different closed loop control system. In an embodiment, the processing tool comprises an auto-tuning module for tuning the closed loop control systems. In an embodiment, the auto-tuning module comprises a noise estimation module, where the noise estimation module determines the noise present in each closed loop control system. In an embodiment, the auto-tuning module further comprises a data collection module, where the data collection module stores process feedback measurements from the closed loop control systems to provide a set of stored data for each closed loop control system. In an embodiment, the sets of stored data are a subset of all available data generated by the closed loop control systems.

DETAILED DESCRIPTION

Auto-tuning and process performance assessment of chamber control in semiconductor processing environments are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects are not described in detail in order to not unnecessarily obscure embodiments of the present disclosure. Furthermore, it is to be understood that the various embodiments shown in the Figures are illustrative representations and are not necessarily drawn to scale.

Temperature and pressure control in semiconductor manufacturing are extremely important to achieve the expected process results. A multiple-station, multi-chamber processing platform can be utilized to improve processing throughput and be able to perform multiple types of processes on a substrate in a sequential fashion. To that aim, such a complex platform has to embed hundreds of sensors to monitor temperature, pressure and flow signals, as well as power usage and kinematics of moving components throughout the platform. In order to make sense of the many sensors, the platform has to embed means to automatically control such signals in order to drive the response variables (e.g., temperature, pressure, etc.) towards the desired targets. As noted above, the controllers need to be initially set up and continuously monitored in order to account for drift of the platform.

Figure 1A:
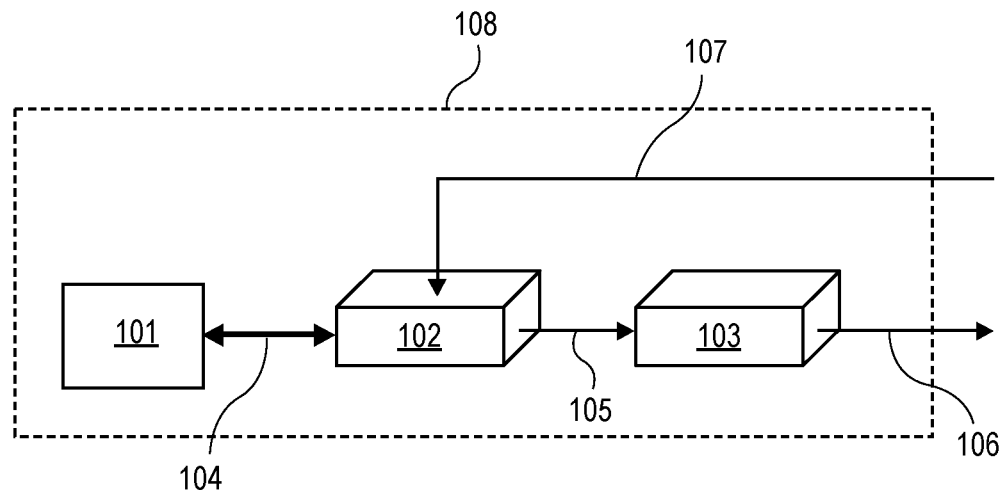
FIG. 1A is a schematic diagram of a single-loop control architecture within a semiconductor processing tool, in accordance with an embodiment.

Some examples of control systems in a semiconductor platform include a temperature-controlled lid, a multi-zone temperature-controlled gas distribution system, temperature-controller faceplates, substrate back pressure controllers, and pressure-controlled ampoules for gas delivery to a process chamber. The number of the above-mentioned controllers within a single process chamber can easily sum up to 50 or more sensors. For example, in one scenario a single chamber may include one lid heater, four faceplate heaters, thirty gas heaters zones, four substrate back pressure controllers, ten pressure-controlled ampoules and reservoirs, and in some cases multiple motorized assemblies to move the susceptor within the process chamber itself Referring now to FIG. 1A, a schematic illustration of the structure of a control architecture 108 is shown, in accordance with an embodiment. In an embodiment, the overall control architecture 108, includes an actuator 103, an input/output (I/O) device 102, and the computing server 101. The actuator 103 delivers the control signal 106 to the process environment. In an embodiment, the actuator 103 may be, but is not limited to, a valve, an amplifier, a silicon controlled rectifier (SCR), a driver, a pump, or a mass flow controller, whose aim is to interface directly with the process hardware to be controlled. In an embodiment, the I/O device 102 receives the process feedback 107. The process feedback 107 may be generated by a sensor that monitors a parameter (e.g., temperature, pressure, etc.) of the process. For example, the process feedback 107 may include, but is not limited to a temperature, a pressure, a flow transducer measurement, or a level transducer measurement.

In an embodiment, the I/O device 102 delivers the process feedback 107 to the computing server 101. The computing server 101 determines a desired reaction and communicates the reaction to the I/O device 102, which in turn relays the desired reaction 105 to the actuator 103. Regardless of the application, the computing server 101 is where the control paradigm is stored and runs. The computing server 101 communicates with the I/O device 102 through the bus 104. That is, the I/O device 102 updates the computing server 101 with the most up-to-date process feedback 107, and the computing server 101 communicates to the I/O device 102 the corresponding desired reaction that should be taken.

Figure 1B:
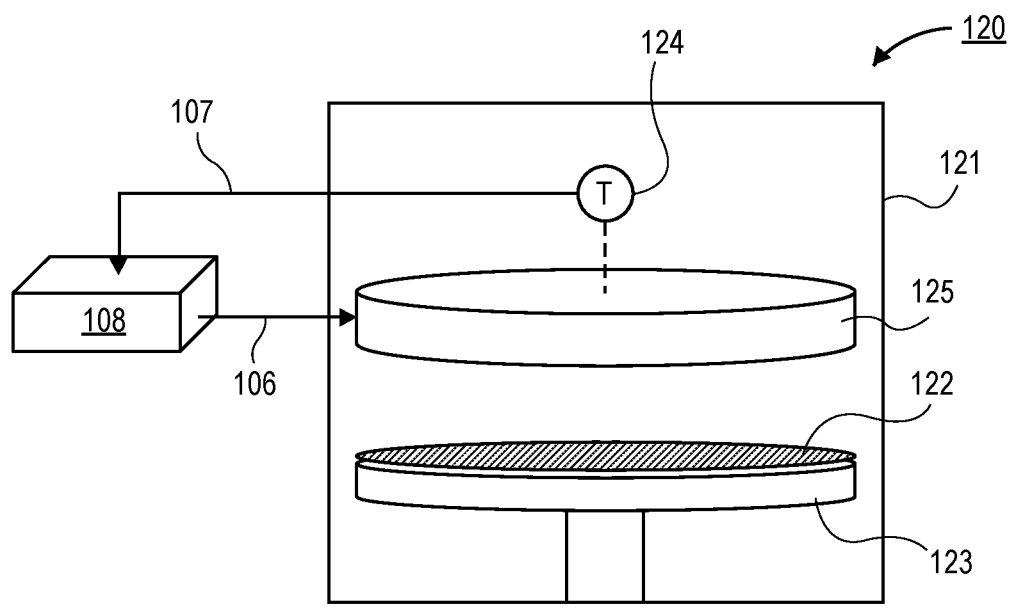
FIG. 1B is a schematic illustration of a semiconductor processing chamber with a temperature controlled component that is controlled with the control architecture of FIG. 1A, in accordance with an embodiment.

Referring now to FIG. 1B, a schematic of a processing tool 120 is shown, in accordance with an embodiment. In an embodiment, the processing tool 120 comprises a chamber 121. A heated faceplate 125 has holes to allow the incoming gas to enter the chamber 121. Part of the thermal energy of the faceplate is transferred to the gas, which then makes its way downward to the substrate 122 sitting on the substrate support 123. Due to the vicinity to the substrate 122, the temperature control of the faceplate is very critical to attain the desired process results. Therefore, a temperature transducer 124 may be used to precisely measure the temperature of the faceplate, and such measurements 107 are used by a control strategy running in the computing server 101 of the control architecture 108 whose aim is to maintain the faceplate temperature at its target value.

For the case depicted in FIG. 1B, the actuator 103 can be an SCR connected to an external power source, and driven by a digital signal 105 provided by the computing server 101 through the I/O device 102. The SCR actuator 103 generates a control signal 106 that controls the temperature of the faceplate 124. As such, the computing server 101 decides how to manipulate the digital signal 105 so that the temperature 107 of the faceplate 125 reaches and stays at the desired value.

Figure 2A:
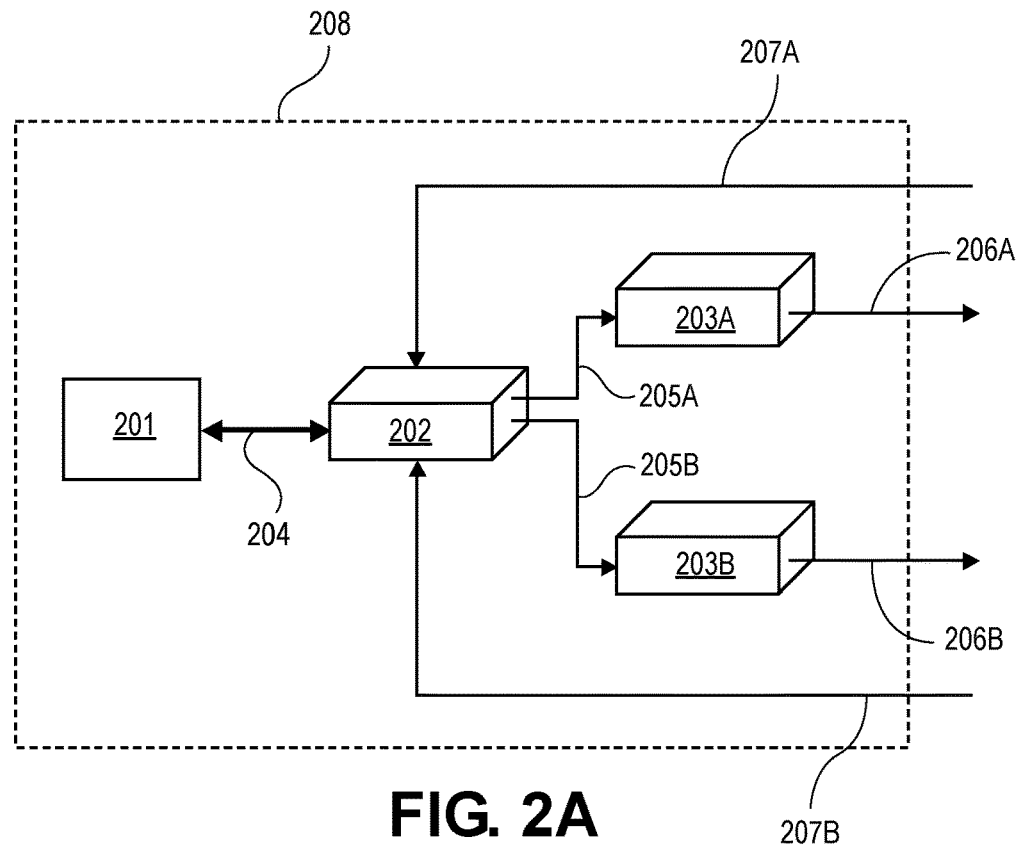
FIG. 2A is a schematic diagram of control architecture for a semiconductor processing tool with two control loops, in accordance with an embodiment.

Referring now to FIG. 2A, a schematic illustration of the structure of a control architecture 208 is shown, in accordance with an embodiment. In an embodiment, the computing server 201 is in charge of controlling two different process feedbacks 207A and 207B using the corresponding control outputs 206A and 206B. For this case, the same I/O device 202 could be used to interface the computing server 201 (over bus 204) with the rest of the control architecture. The computing server 201 determines a desired reaction and communicates the reaction to the I/O device 202, which in turn relays the desired reactions 205A and 205B to the actuators 203A and 203B, respectively. In an embodiment, two different actuators 203A and 203B may be used for the control of the process feedbacks 207A and 207B, respectively. The control architecture 208 in FIG. 2A is said to contain two closed-loop controls. A first closed-loop control is for the control of the process feedback 207A and a second closed-loop control is for the control of the process feedback 207B.

Figure 2B:
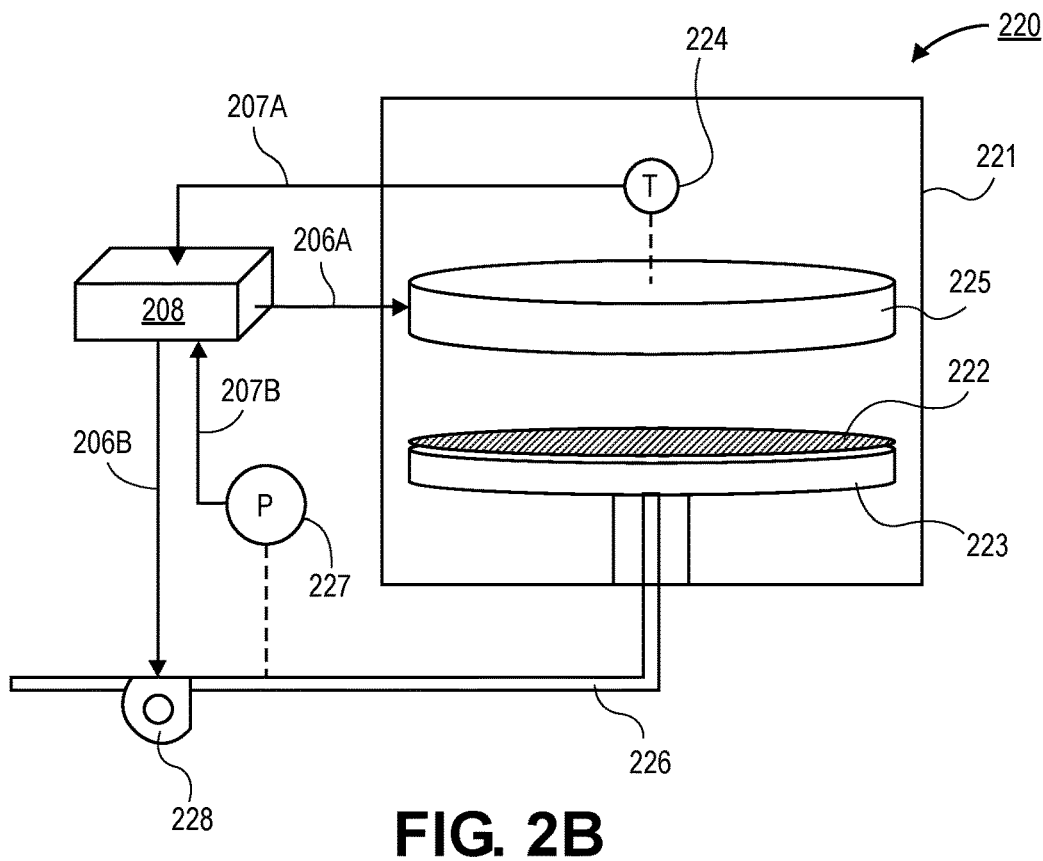
FIG. 2B is a schematic illustration of a processing chamber with a temperature controlled component and a pressure controlled component that are controlled with the control architecture of FIG. 2A, in accordance with an embodiment.

Referring now to FIG. 2B, a schematic of a processing tool 220 is shown, in accordance with an embodiment. In an embodiment, the processing tool 220 is an example of a two closed-loop control architecture. In addition to the control of the faceplate 225 temperature, the control architecture 208 also controls the substrate backside pressure. For this example, the pressure measurements 207B are obtained using a manometer 227, which measures the pressure in the gas line 226. The server 201 receives real-time notifications of the pressure feedback 207B, and reacts by commanding a mass flow control actuator 203 to drive the pump 228 in response to control output 206B.

Similar to the embodiment shown in FIG. 1B, the substrate 222 is on a substrate support 223 below the faceplate 225. A temperature transducer 224 supplies a temperature feedback 207A to the control architecture 208. The server 201 receives real-time notifications of the temperature feedback 207A, and reacts by commanding a temperature control actuator 203 (e.g., an SCR) which imparts a control signal 206A which controls the temperature of the faceplate 225.

In the illustrated embodiment, a pair of closed-loop controls are shown. However, it is to be appreciated that in actual processing tools, the overall control architecture for the tool 220 may comprises a high number of closed-loop controls (e.g., 40 or more closed-loop controls). In an embodiment, each loop is designed to interface with a different transducer and actuator.

Figure 3:
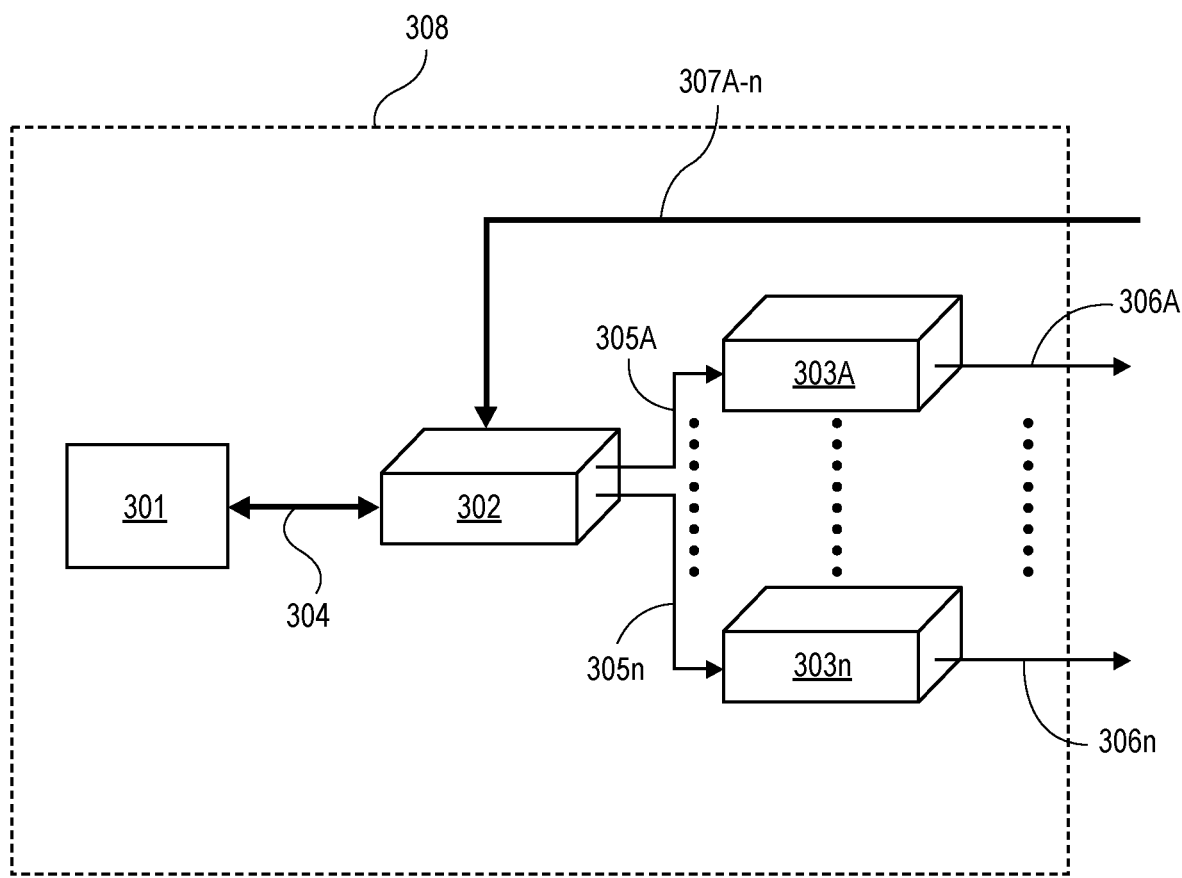
FIG. 3 is a schematic diagram of control architecture for a semiconductor processing tool with a plurality of control loops, in accordance with an embodiment.

Referring now to FIG. 3, a schematic illustration of the structure of a control architecture 308 with a plurality of closed-loop controls is shown, in accordance with an embodiment. In FIG. 3, feedback signal bus 307A-n is a bus that comprises feedback lines from all the transducers. In an embodiment, the number of actuators 303A-303n is equal to the number of feedback signals 307. The I/O device 302 may communicatively couple to each of the actuators 303A-303n by digital signals 305A-305n. The actuators 303A-303n may be coupled to the system by control signals 306A-306n. As shown, a single computing server 301 may interface with each of the actuators 303A-303N through a bus 304 coupled to the I/O device 302.

It is to be appreciated that as the value of n increases, so does the engineering time required to tune all the controllers within the control architecture 308, as well as the setup time needed to make the chamber ready to run recipes. Moreover, engineers assigned to the tuning task are required to possess specific skills to accomplish the task, hence extending even further the chamber setup time due to potential unavailability of such engineers. Such tuning is also needed before a tool is run for the first time.

After an extended period of operation of the chamber, it is normal for some of the hardware components to show altered behavior and/or performance. Sometimes re-tuning the different closed-loop controllers could be enough to compensate for such a drift. However, this task also requires a significant amount of engineering time, corresponding to an equally long period of chamber down-time. As an abundance of precaution, or perhaps as a best practice, it may even be advisable to periodically re-tune some of the closed-loop controllers. Such measures could be taken, for instance, during already scheduled down-times of the chamber. However, the large amount of resources needed to accomplish the task may be the reason why it is seldom performed.

Accordingly, embodiments disclosed herein include methods to automatically tune all the loops within the control architecture 308. This reduces the amount of engineering time required to a level that could be considered negligible. Embodiments also require a significantly less critical skillset for lab operators who use the auto-tuning method disclosed herein. Additionally, lab operators can schedule the tuning activity to be carried out automatically at a time where the chamber is not usually operated (for instance, overnight). Additionally, the availability of such an auto-tuning method simplifies the scheduling of periodic maintenance, or of any maintenance triggered by any known system fault or drift.

For the above benefits to apply to semiconductor manufacturing tools, the auto-tuning method may comprise the ability to use the method reliably and accurately with minimal assistance, in a real-time software environment. The processes monitored may have an unknown bandwidth and, potentially, processes with bandwidths with different magnitude of scale. In addition, the auto-tuning should have a minimal footprint on the amount of server memory required. As such, the method can be performed simultaneously on a large number of processes within each chamber, and it can run in the background while other activities are being carried out around the tool.

It is to be appreciated that auto-tuning methodologies with the above characteristics are not currently used within a semiconductor manufacturing facility. For one reason, third-party auto-tuning software it typically not allowed to be used within the proprietary software infrastructure common in the semiconductor industry. Additionally, similar methods are often subjected to less stringent requirements. For example, such methods run on dedicated computers only running the auto-tuning routine (and no other resource-intensive processes). Furthermore, existing processes are designed to be used on a single closed-loop control at a time. Accordingly, such methods are not compatible with a semiconductor manufacturing facility, and the methods would not be practical towards the minimization of the chamber down-time.

In addition to auto-tuning functionality, embodiments disclosed herein may also provide the ability to monitor the performance of the n closed-loop controllers throughout process recipes. In a complex system where the value of n is large, it is often important that each loop's performance is monitored throughout a process recipe. This allows for any performance drift to be reported in a timely manner, and for the loops where the drifts occurred to be identified. Identifying the drifting loops speeds up the process of finding the root cause of the drifts, and minimizes potential production waste.

Figure 4:
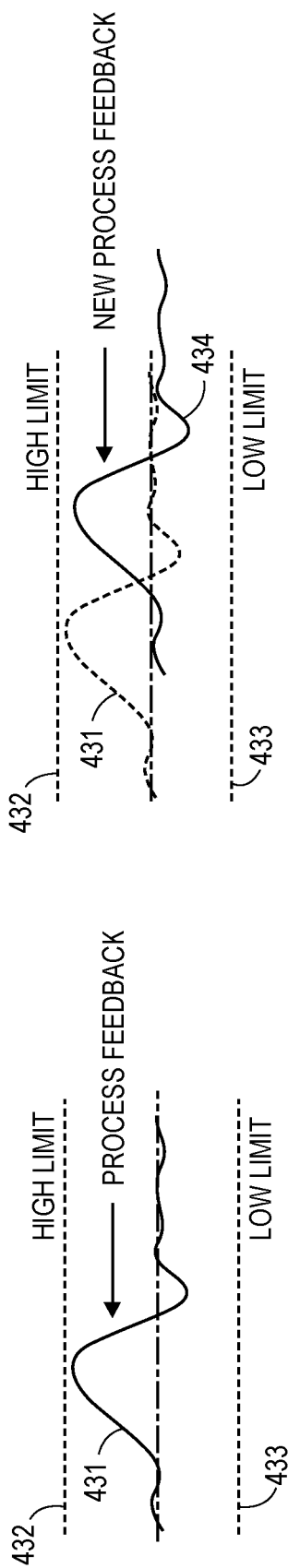
FIG. 4A is a graph of a response variable over time, in accordance with an embodiment.
FIG. 4B is a graph of a response variable over time compared with a known value of the response variable over time, in accordance with an embodiment.

Common performance monitors allow for monitoring whether the process feedback (e.g., feedback 107 described above) exceeds some preset limits, changes more quickly/slowly than expected, or deviates too far from the desired value. Similarly, common performance monitors notify the user if the controller action 106 exceeds predetermined limits. However, as shown in FIGS. 4A and 4B, such common performance monitors sometimes fail to identify if the process feedback behaved as expected. For example, the process feedback 431 in FIG. 4A may represent the expected process behavior during a specific process recipe. As shown in FIG. 4A, the process feedback 431 is contained within the drift limits 432 and 433, and the process behavior is therefore considered acceptable. In FIG. 4B, however, the process feedback 434 observed during a later execution of the same process recipe appears shifted in time with respect to the behavior 431 observed in earlier recipes. Since the behavior 434 is contained within the limits 432 and 433, common performance monitors would consider process behavior 434 as acceptable. However, the behavior 434 is not as expected if the expectation is set by behavior 431.

The recipe performance monitor described in accordance with embodiments disclosed herein can solve the problem described above. That is, the recipe performance monitor provides the user with real-time information on whether each of the closed-loop controllers is performing as expected throughout a recipe. For such a performance monitor to work within a semiconductor processing server, similar requirements to those mentioned for the auto-tuning method are needed. The recipe performance monitor has to be able to run in a real-time server environment, the recipe performance monitor has to minimize the server memory usage to allow multiple loops to be monitored simultaneously, and the recipe performance monitor has to run in the background while the closed-loop controllers are operative. Minimization of the server memory usage is critical and non-trivial. In fact, process recipes could be a few minutes long to a few hours long. Moreover, the monitored signals could refresh at very fast rates. That is, the time between two consecutive updates of the same signal could be very short. As such, a large number of data samples per unit of time may be available for analysis. Hence it is critical for the recipe performance monitor to be able to optimize data in real-time.

Some instances of recipe performance monitors can be found in non-real-time environments. When implemented in an offline capacity, the recipe monitor is not bound to memory usage limitations. Instead, such monitors are typically running offline on dedicated servers. The benefit of a performance monitor in a real-time environment is the ability to receive immediate notifications in correspondence to unexpected performance across the semiconductor processing tool. In turn, this minimizes production waste.

Embodiments disclosed herein include an auto-tuning method intended to simultaneously and automatically tune the majority of the closed-loop controllers in a chamber, and a recipe performance monitor intended to monitor the performance of such controllers throughout process recipes. These two applications are based on similar underlying methods for data mining. The data mining process makes these applications suitable for real-time execution due to low-memory usage, and low execution cost.

During an offline data analysis, the entire data set is available prior to the analysis being performed. Such data is available as a time-series, often with data points equally spaced in time. In contrast, in a real-time data analysis, the entire data time-series is not available at the time that the analysis is carried out. That is, only past and present data can be used. Moreover, in a real-time data analysis, it is often not possible to collect and store data at a specific time rate. This is because when the time-series is too long, the system may run out of available memory resources prior to the end of the process recipe. Therefore, on-line data analysis is inherently more challenging because: 1) it requires a more efficient way of determining which incoming data point is worth storing for future analysis; and 2) the analysis performed on past and current data could lead to misleading results since the full picture is not available at the time that the analysis is performed.

Figure 5:
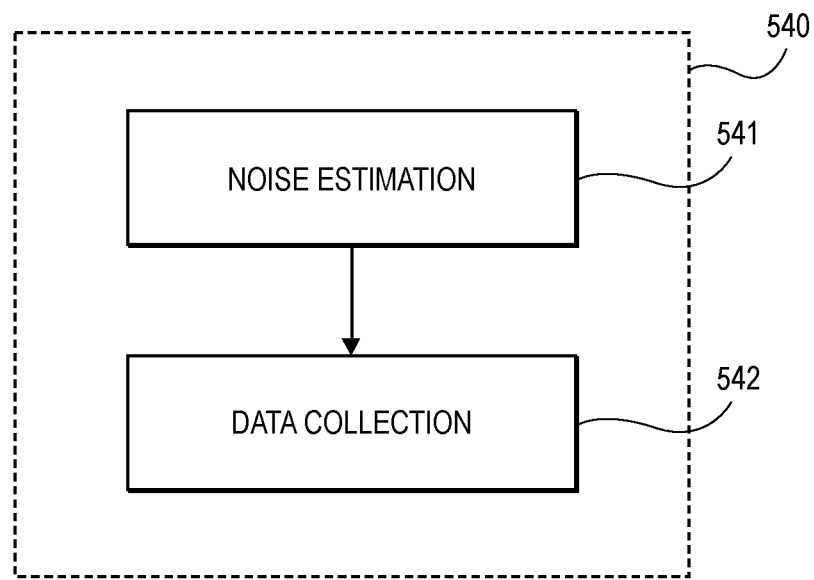
FIG. 5 is a process flow diagram method of data collection for improved closed loop control in a semiconductor manufacturing tool, in accordance with an embodiment.

Referring now to FIG. 5, a process flow diagram of a process 540 for data mining is shown, in accordance with an embodiment. As shown in FIG. 5, the method developed for incoming data point selection includes the operations of a noise estimation operation 541 followed by a data collection operation 542. During the noise estimation operation 541, the noise in the signal is estimated to determine what variations of the process feedback correspond to real variations in the process response, and what variations are instead due to measurement errors. Noise can be due to interference from external power/magnetic sources or transducer inaccuracy, and it is characterizable as high frequency variation, with frequency content in a range well beyond the bandwidth of the process.

In an embodiment, the noise estimation operation 541 does not need to be executed at every time that data needs to be collected. For example, the noise estimation operation may be run prior to every data collection, once per day, once per month, once per year, or any other preset duration. The result of the noise estimation operation 541 is a single value that is utilized by the subsequent data collection operation, or the value can be retained for future reference.

Figure 6:
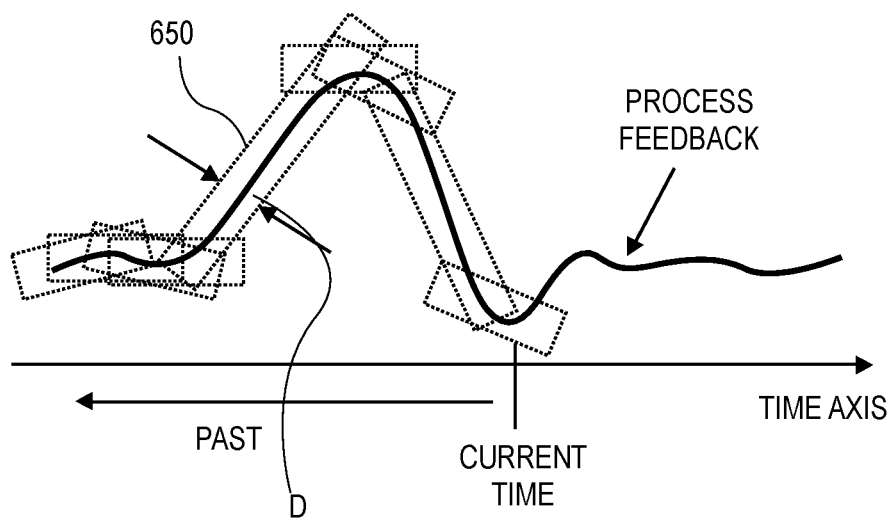
FIG. 6 is a graph illustrating the geometric reduction of a response variable, in accordance with an embodiment.

During the data collection operation 542, consecutive data are grouped into rectangle boxes 650 as shown in FIG. 6. In an embodiment, the height D of the rectangle boxes 650 is a function of the noise estimation. In an embodiment, the length of the rectangle boxes 650 depends on the variability of the process feedback. That is, if consecutive data points fit within a given box, the relative variation among such data points is discarded. In an embodiment, new boxes are created as a function of the noise level, the amount of variation of the process feedback, and the relative inclination of such boxes. For each box only one data point must be memorized, and the remaining data points can be discarded, until a new box is created. With this method the amount of data points collected is enormously reduced by a factor that is inversely proportional to the sampling rate of the raw process feedback measurements. Moreover, the value of the process feedback at any point of time can be easily retrieved from the collected data through a simple interpolation from the stored adjacent data points.

It is to be appreciated that the data collection through the rectangle box 650 approach allows for the stored data to be insensitive to the sampling rate of the data. For example, if data is obtained at a micro-second rate, a nano-second rate, a second rate, or any rate, the total data stored comprises a single value within the rectangle box 650 and the shape/inclination of the rectangle box. That is, the recorded data is a small subset of all possible data. Due to the lower amount of data needed, embodiments allow for the data collection and analysis to be run in real time, instead of needing to be run offline on dedicated analysis servers.

Figure 7:
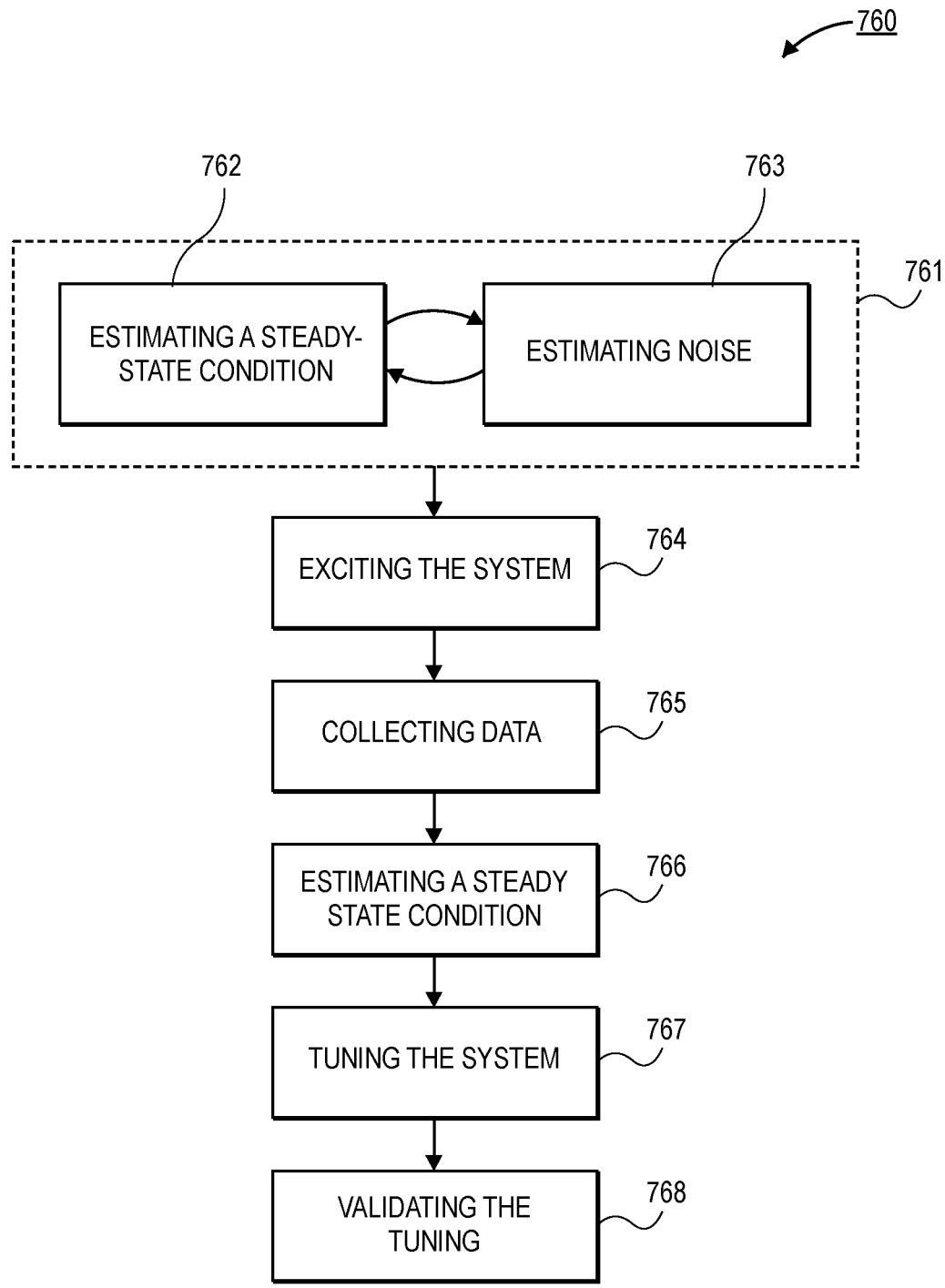
FIG. 7 is a process flow diagram of a method of auto tuning a semiconductor tool, in accordance with an embodiment.

Referring now to FIG. 7, process flow diagram of a process 760 for auto-tuning a closed-loop controller is shown, in accordance with an embodiment. In an embodiment, the process 760 may begin with a user command to initiate the process 760. In other embodiments, the process 760 may be initiated automatically. For example, the process 760 may be initiated after a preset duration of time, or after a preset number of recipe cycles have been run. In an embodiment, the first operation 761 of the auto-tuner is two-fold. The first operation 761 includes determining the noise within the process feedback measurements at operation 763, and assessing if the process feedback is at steady-state at operation 762. Operation 762 is critical to improve the accuracy of a future tuning operation 767. The process feedback is assumed to be at a steady-state based on an analysis of the orientation with respect to the time axis of the rectangles generated from the data collected.

Once the noise is measured and the process feedback is assessed to be at steady-state, the process 760 continues with operation 764, which comprises exciting the system. In an embodiment, an excitation signal is injected into the system. The excitation signal is capable of exposing the main characteristics of the process to be controlled. The excitation signal is a change of an input into the system. For example, in the context of a closed-loop controller that is controlling temperature, the excitation signal may be an increase in power to a heater.

After the excitation operation 764, the process may continue with operation 765, which comprises collecting data. The data collection operation 765 may be substantially similar to the data collection process 542 described above with respect to FIG. 5. That is, the data collection process 542 may comprise generating a plurality of rectangular boxes that substantially match the shape of the process feedback graph. For example, a single data point within the box and the shape/inclination of the box may be the only data that is stored. As such, the stored data is a subset of the generated data. The smaller amount of data allows for real-time processing of the data.

In an embodiment, the data collection operation 765 continues until the process is considered to be at steady-state, as indicated by operation 766. Similar to above, the process is considered to be at a steady-state based on an analysis of the orientation with respect to the time axis of the rectangles generated from the data collected.—Once the process reaches a steady-state, the data collected up to then is analyzed, with a tuning operation 767. In an embodiment, the tuning operation 767 is carried out with the aim of determining all the gain values of the closed-loop controller.

After the tuning operation 767, the process 760 may continue with operation 768 which comprises validating the tuning. The validation operation is performed by comparing the collected data to an internally simulated model derived from such data. Such a validation is useful to determine if the tuning results are reasonable based on the data previously collected. In an embodiment, the validation operation may also include, when needed, a comparison to a physics based model. A physics based model is a virtual representation of the control loop, and uses physics based equations to model the system behavior.

Figure 8:
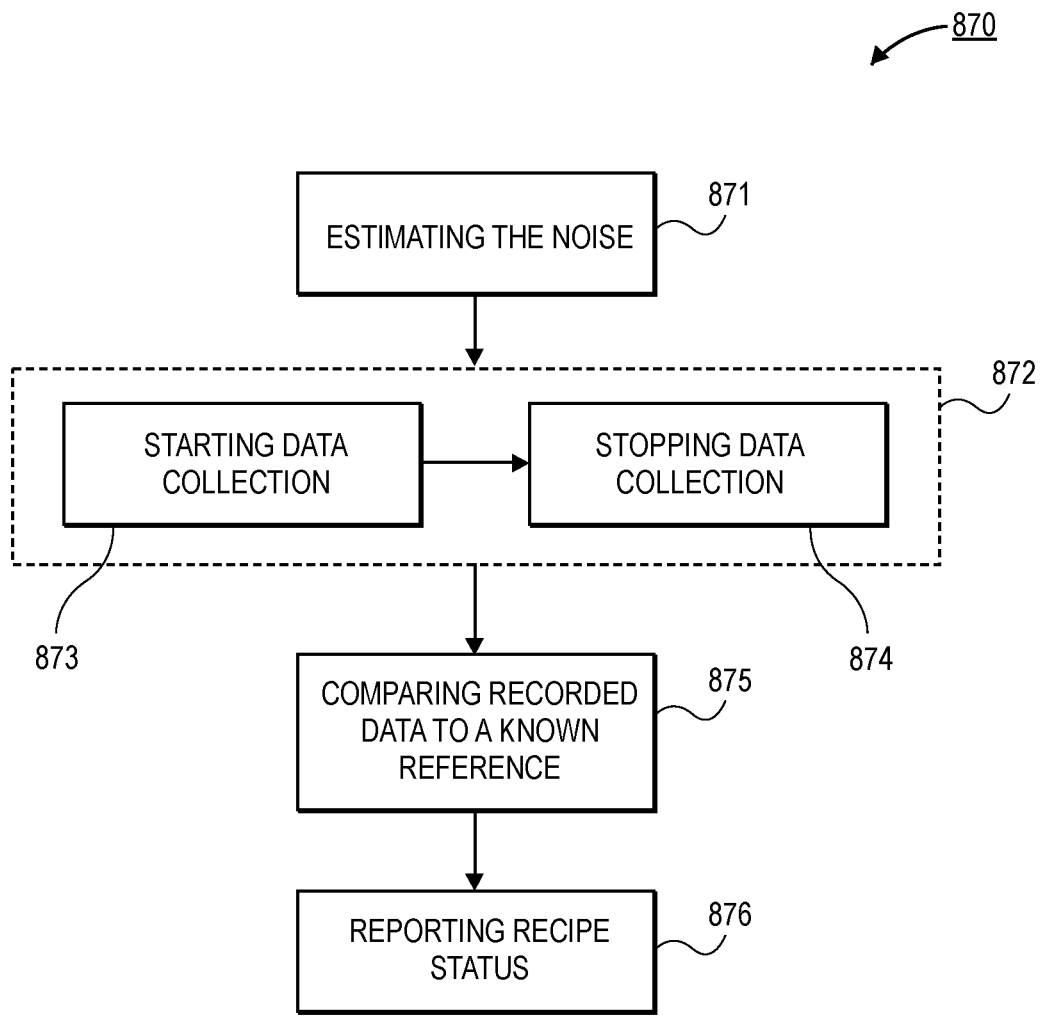
FIG. 8 is a process flow diagram of a method of monitoring a recipe on a semiconductor tool, in accordance with an embodiment.

Referring now to FIG. 8, a flow diagram of a process 870 is shown, in accordance with an embodiment. The process 870 may include a process for monitoring recipes as they are executed. In an embodiment, the process 870 may begin with a start command to signal the beginning of the process recipe. The start command may be automatically generated at the start of a new process recipe. For example, all instances of a process recipe may be monitored with process 870. In other embodiments, the recipe monitoring process 870 may monitor a subset of all iterations of a process recipe. In an embodiment, the same recipe performance analysis process 870 can be applied to portions of the recipes, as desired, with the proper timing of the start and stop commands. That is the entire duration of a process recipe may not be monitored in some embodiments.

In an embodiment, the process 870 begins with operation 871 which comprises estimating the noise. The noise estimation operation 871 may be substantially similar to the noise estimation operation 541 in FIG. 5. After the noise estimation operation 871, the process may continue with operation 872 which comprises starting data collection 873 and stopping data collection 874. The data collection 872 may be substantially similar to the data collection 542 in FIG. 5. That is, the data collection process 542 may comprise generating a plurality of rectangular boxes that substantially match the shape of the process feedback graph. For example, a single data point within the box and the shape/inclination of the box may be the only data that is stored. As such, the stored data is a subset of the generated data. The smaller amount of data allows for real-time processing of the data.

In some embodiments, the stored data may be considered the "standard" data set. That is, future analysis will be based on a comparison between the performance recorded as the "standard" and the currently recorded data. The "standard" data set may be repopulated after a preset number of iterations of the recipe, after a certain time period (e.g., days, weeks, a year, etc.), or after maintenance on the processing tool.

In an embodiment, process 870 may continue with operation 875 which comprises comparing the recorded data to a known reference. For example, the known reference may be the "standard" data set. In other embodiments, the known reference may be a data set from the previous iteration of the recipe. In an embodiment, process 870 then continues with operation 876 which comprises reporting the recipe performance status. The reporting may include a warning that the recipe has deviated from the "standard" data set, and/or may include other statistical information about the process as an output. In an embodiment, deviations from the "standard" data set may include changes in the shape, size, and orientation of the rectangular boxes. Alternatively, the shape, size, and orientation of the boxes may be similar to the "standard" data set, with the exception of the new data having a time delay (e.g., similar to the embodiment shown in FIG. 4B).

Figure 9:
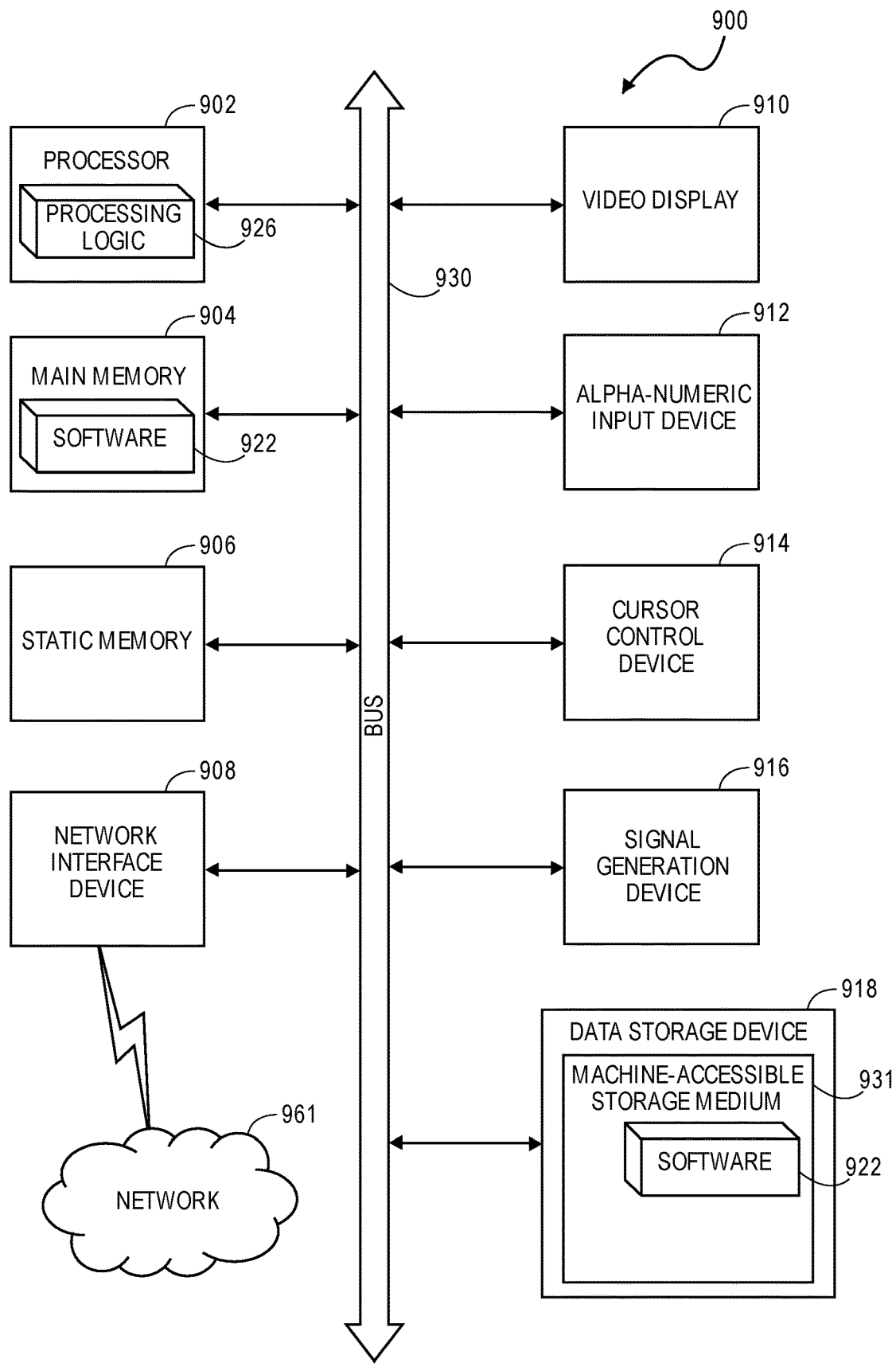
FIG. 9 illustrates a block diagram of an exemplary computer system, in accordance with an embodiment of the present disclosure.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), MRAM, etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of monitoring a process recipe using a data mining algorithm that is run in real-time.

Thus, methods for monitoring a process recipe using a data mining algorithm that is run in real-time have been disclosed.

What is claimed is:

1. A method for auto-tuning a system, comprising: determining if the system is in a steady state; exciting the system; storing process feedback measurements from the excited system to provide a set of stored data, wherein the set of stored data is a subset of all past and present collected data generated by the excited system; determining when the excited system returns to the steady state; and tuning the system using the set of stored data; wherein the storing, determining, and tuning is performed based on a rectangle box approach that takes into consideration dimensions and orientations of rectangle boxes.

2. The method of claim 1, further comprising:
   determining a level of noise within process feedback measurements before exciting the system.

3. The method of claim 2, wherein the level of noise is determined for each iteration of the method.

4. The method of claim 2, wherein the level of noise is determined before a first iteration of the method and after a preset number of iterations of the method, or after a preset period of time.

5. The method of claim 1, wherein storing process feedback measurements, comprises:
   grouping consecutive data points into a series of rectangular boxes, wherein only a first data point in a given rectangular box is stored as part of the set of stored data.

6. The method of claim 5, wherein a height of the box is a function of noise in the system.

7. The method of claim 5, wherein the excited system returns to the steady state when a rectangular box has an inclination that is substantially parallel to a time axis.

8. The method of claim 1, wherein tuning the system includes setting gain values of a closed loop controller of the system.

9. The method of claim 8, further comprising:
   validating the tuning by comparing the collected data to an internally simulated model which is obtained from information extracted from the stored data, or from a first-principle analysis of the system.

10. The method of claim 1, wherein the system is a closed loop control system in a semiconductor manufacturing tool.

11. The method of claim 10, wherein the closed loop control is of a thermal system or a pressure system.

12. The method of claim 1, wherein the system is a plurality of closed loop control systems in a semiconductor manufacturing tool.

13. A method of monitoring a recipe performance in a semiconductor processing tool, comprising: determining a level of noise in a system; storing process feedback measurements from the system to provide a set of stored data, wherein the set of stored data is a subset of all past and present collected data generated by the system; and comparing the set of stored data with a set of reference data; determining when the system returns to steady state; and tuning the system using the set of stored data; wherein the storing, determining, and tuning is performed based on a rectangle box approach that takes into consideration dimensions and orientations of rectangle boxes.

14. The method of claim 13, wherein the set of reference data is from a known good iteration of the recipe.

15. The method of claim 13, further comprising:
   reporting a recipe performance status when the set of stored data differs from the set of reference data.

16. The method of claim 15, wherein the difference between the set of stored data and the set of reference data is a time delay shift of recorded data points.

17. The method of claim 13, wherein storing process feedback measurements, comprises:
   grouping consecutive data points into a series of rectangular boxes, wherein only a single data point in a given rectangular box is stored as part of the set of stored data.

18. A semiconductor processing tool, comprising: a chamber; a plurality of components interfacing with the chamber, wherein each of the components are controlled with a different closed loop control system, wherein the processing tool comprises an auto-tuning module for tuning the closed loop control systems, wherein the auto-tuning module comprises: a noise estimation module, wherein the noise estimation module determines the noise present in each closed loop control system; and a data collection module, wherein the data collection module stores process feedback measurements from the closed loop control systems to provide a set of stored data for each closed loop control system, wherein the sets of stored data are a subset of all past and present collected data generated by the closed loop control systems; wherein when the closed loop control systems return to steady state the closed loop control systems are tuned using the set of stored data; wherein the storing and tuning is performed based on a rectangle box approach that takes into consideration dimensions and orientations of rectangle boxes.

19. The method of claim 18, wherein storing process feedback measurements, comprises:
   grouping consecutive data points into a series of rectangular boxes, wherein only a single data point in a given rectangular box is stored as part of the set of stored data.

20. The method of claim 18, wherein the plurality of components interfacing with the chamber comprises a temperature controlled component and a pressure controlled component.

\* \* \* \* \*